United States Patent [19]
Evenstad

[11] Patent Number: 5,453,834
[45] Date of Patent: Sep. 26, 1995

[54] DIGITAL BURST FREQUENCY TRANSLATOR

[76] Inventor: James O. Evenstad, 174 Juniper St., Mahtomedi, Minn. 55115

[21] Appl. No.: 225,802

[22] Filed: Apr. 11, 1994

[51] Int. Cl.⁶ ............................................. G01B 9/02
[52] U.S. Cl. .................... 356/345; 356/349; 356/28.5; 364/510
[58] Field of Search ................... 356/345, 349, 356/336, 27, 28.5; 364/510, 565

[56] References Cited

U.S. PATENT DOCUMENTS

| | | |
|---|---|---|
| 3,777,133 | 12/1973 | Beck et al. . |
| 3,824,015 | 7/1974 | Petit et al. . |
| 3,842,252 | 10/1974 | Jakeman et al. . |
| 4,019,038 | 4/1977 | Critten et al. . |
| 4,244,026 | 1/1981 | Dickey, Jr. . |
| 4,329,054 | 5/1982 | Bachalo .................. 356/336 |
| 4,540,283 | 9/1985 | Bachalo . |
| 4,596,254 | 6/1986 | Adrian et al. . |
| 4,610,540 | 9/1986 | Mossey .................. 356/28.5 |
| 4,755,795 | 7/1988 | Page .................. 340/347 SH |
| 4,786,168 | 11/1988 | Meyers et al. .......... 356/28.5 |
| 4,799,677 | 1/1989 | Frederiksen ............ 364/521 |
| 4,843,564 | 6/1989 | Jenson .................. 364/510 |
| 4,899,289 | 2/1990 | Appel .................. 356/27 |
| 4,918,532 | 4/1990 | O'Conner . |
| 4,967,272 | 10/1990 | Kao et al. . |
| 4,973,969 | 11/1990 | Jenson .................. 342/189 |
| 4,986,659 | 1/1991 | Bachalo .................. 356/336 |
| 5,005,144 | 4/1991 | Nakajma et al. . |
| 5,179,418 | 1/1993 | Takamiya et al. .......... 356/28.5 |
| 5,267,011 | 11/1993 | Callender .................. 356/28.5 |

*Primary Examiner*—Samuel A. Turner
*Attorney, Agent, or Firm*—Frederick W. Niebuhr; Haugen and Nikolai

[57] ABSTRACT

A device for detecting and measuring analog coherent frequency bursts includes circuitry for digitally translating the bursts upon their detection. Based on a frequency range estimate, a sampling frequency is selected to govern conversion of the analog burst to a sequence of digital values, which are stored to a sequential memory. The digital values later are read out of the memory to a digital-to-analog converter at a predetermined read frequency. The D/A converter output is low-pass filtered to provide a reconstructed analog burst. Sampling rates are selected to limit the frequency range of reconstructed bursts to a single octave, which enables subsequent signal processing with simpler circuitry, for reduced cost and improved accuracy and reliability of measurements obtained.

33 Claims, 5 Drawing Sheets

DIGITAL BURST FREQUENCY TRANSLATOR

BACKGROUND OF THE INVENTION

The present invention relates to circuitry for processing electrical signals, and more particularly to circuitry for changing the frequency of such signals to enhance their subsequent further processing and analysis.

Over the years, numerous instruments have been developed for measuring physical phenomena by detecting energy generated due to the phenomena and converting the energy to electrical signals. The electrical signals are processed to obtain information on a wide variety of physical characteristics, e.g. the location, size and velocity of an object, or its index of refraction, transmissivity or surface characteristics. In many applications, signals occur intermittently and randomly and vary in their amplitude and duration. Further, the signals may be expected to occur over a wide frequency bandwidth in which frequencies near the upper end of the bandwidth are at least several orders of magnitude greater than frequencies at the lower end.

While such applications can involve radar and sonar, the present invention is more directly concerned with laser Doppler velocimetry (LDV), also known as laser Doppler anemometry. LDV systems are known for their utility in measuring instantaneous velocities of discrete elements in two-phase flows, e.g. liquid sprays in air, or fine particles in fluid streams. In a conventional LDV apparatus, one or more pairs of spatially separated laser beams intersect one another and interfere with one another to form a measuring volume. The measuring volume is typically quite small, and the concentration of particles sufficiently low, so that at any given time no more than one particle is within the measuring volume. One or more photodetectors receive the coherent light scattered by particles passing through the measuring volume. The Doppler frequency, obtained by measuring the electrical signal generated as a function of light received by the photodetector, measures particle velocity and thus the velocity of the particle-carrying medium. Doppler frequency is proportional to particle velocity.

Laser phase Doppler systems are closely related to LDV systems and employ a phase difference between two separate Doppler frequency signals to determine the size of a moving particle. More particularly, two or more photodetectors receive light scattered by a particle passing through a measuring volume. The photodetectors receive light from different locations relative to the measuring volume. The difference in phase between signals from the photodetectors provides the particle size information.

Particles, especially spherical particles, tend to scatter light in all directions and thus lend themselves well to analysis by laser Doppler techniques. However, physical characteristics of systems under analysis can lead to problems in analyzing the resultant electrical signals. Given the typically low particle density and small size of the measuring volume, particles traverse the measuring volume individually and in intermittent, random fashion. The resultant electrical signal is a composite of background noise and occasional coherent frequency components, known as "bursts" superimposed on the background noise. Thus, signal processing circuitry should be capable of distinguishing the coherent frequency bursts from noise to avoid wasteful attempts to analyze the noise. The coherent frequency bursts tend to be non-uniform in amplitude, frequency and duration. Signal amplitudes vary with particle size, but also with varying tendencies of particles to absorb rather than scatter the laser energy. Signal frequencies can vary over orders of magnitude, particularly in turbulent flow systems. The length or duration of the bursts can vary considerably, even under conditions of uniform particle size and velocity, depending upon whether a particle is substantially centered as it traverses the measuring volume.

Known processing techniques, e.g. involving LDV counters, are capable of processing coherent frequency bursts in real time. However, the signal is prone to distortion and noise that depends on signal frequency, amplitude and processing bandwidth. Thus, the nature and degree of distortion is difficult to predict.

Alternatively, the electrical signals can be sampled and converted to corresponding digital signals and then processed digitally. While digital sampling and processing do not eliminate distortion, the distortion is more predictable. Typical digital processing techniques include signal correlation and fast Fourier transform. A disadvantage of this approach is that sampling and processing time can considerably exceed burst durations, seriously decreasing the rate at which the burst signals can be processed.

Given the wide range of possible burst signal frequencies, circuitry for processing the signals must be capable of functioning over a broad frequency band. This requirement calls for circuitry which is more complex, more costly and less reliable than circuitry tailored to handle a narrower frequency bandwidth.

To address this difficulty, analog and digital processors have been used to heterodyne, or translate, the signal frequency. Typically, analog mixing techniques are employed to limit the frequency range of signals subject to further processing, thus to reduce the complexity of processing circuitry. Analog mixing, however, is subject to reduced signal-to-noise ratio due to mixer insertion loss and post-mixer amplification and filtering. Intermodulation distortion and harmonic distortion also increase noise.

Therefore, it is an object of the present invention to provide circuitry for real time processing of analog signals, while minimizing noise and signal distortion.

Another object of the invention is to provide a process for rapidly adjusting the frequency bandwidth of electrical signals before further processing of the signals.

A further object is to provide a means for receiving signals over a broad range of frequencies and conditioning the signals for further processing within a considerably narrowed frequency bandwidth.

Yet another object is to provide simpler, less costly and more reliable circuitry for frequency translation of coherent frequency bursts.

SUMMARY OF THE INVENTION

To achieve these objects, there is provided a process for measuring a coherent frequency analog signal, including the following steps:

a. receiving an analog coherent frequency signal, and generating a frequency range value indicating an approximate frequency of the received analog coherent frequency signal;

b. predetermining a plurality of sampling rates, each sampling rate corresponding to a different one of a plurality of frequency bandwidth segments that together comprise a frequency bandwidth for receiving the analog coherent frequency signal;

c. selecting one of the plurality of sampling rates, based on the frequency range value;

d. converting the analog coherent frequency signal to a first digital signal by sampling the analog coherent frequency signal at the selected sampling rate;

e. storing the first digital signal to a memory as a sequence of digital values, each digital value corresponding to one sample of the analog coherent frequency signal;

f. reading the first digital signal out of the memory in the sequence and at a predetermined read frequency to generate a second digital signal within a reduced frequency bandwidth; and g. converting the second digital signal to an analog signal, thus to generate a reconstructed analog low noise signal and filtering with a bandpass filter corresponding to the analog coherent frequency signal.

Preferably, each bandwidth segment is predetermined as to range, such that the ratio of its highest frequency to its lowest frequency is at most two. Accordingly each bandwidth segment has a range of one octave or less. The full bandwidth typically is a decade, i.e. with the highest frequency being about ten times the lowest frequency of the range. A controller can be provided to select one of several sampling rates, each rate associated with one of the bandwidth segments. Consequently, despite a broad range of initial signal frequencies, appropriate matching of sampling rates and estimated frequencies controls and confines the relationship of the signal and sampling frequencies. For example, the number of samples per cycle of the analog coherent frequency signal can be confined to within a predetermined range such as 5–10 samples/cycle.

Conversion to the first digital signal proceeds at the selected sampling rate, and preferably comprises generating multiple eight-bit binary words, each binary word corresponding to one of the samples and representing a digital value. The first digital signal is stored as a sequence of the binary words.

The second digital signal is generated by reading the digital values out of the memory, in the sequence, and at the predetermined read frequency. While the read frequency most directly controls the number of digital values or samples read per second, it also controls the cycles per second, based on the aforementioned relationship of samples and cycles of the original signal. More particularly, if appropriate selection of sampling rates confines the number of samples per cycle to a range of 5–10, the resulting digital signals read out of the memory fall within a one octave frequency range. The reconstructed analog signals, likewise, lie within this limited frequency bandwidth. The predetermined read frequency further positions the narrowed frequency bandwidth, i.e. at least approximately determines the maximum and minimum frequencies within the bandwidth.

To further enhance signal processing accuracy, the reconstructed analog signal can be low pass filtered (preferably approximately at the Nyquist value) before it is processed. The available range at which coherent frequency bursts are processed can be enhanced considerably by band-pass filtering of the incoming analog coherent frequency signal. In a specific application, sixteen band-pass filters are used in combination to sense frequencies varying from 300 Hz through 100 MHz.

The manner in which the reconstructed analog signal is processed depends upon the requirements of the physical system. In a velocity measurement system, the reconstructed analog signal is processed to accurately determine its frequency. This measuring frequency is combined with the known selected sampling rate to accurately determine the frequency of the original analog coherent frequency signal, i.e. the burst frequency. Then, particle velocity is determined as a function of the burst frequency.

Alternatively, particle sizes can be determined based on differences in phase between several frequency bursts based on the same particle. This requires two or more photodetectors angularly spaced apart from one another, each generating an analog coherent frequency burst responsive to receiving energy scattered by the particle. The burst signals are separately converted and reconstructed as described above, for processing within a narrowed frequency bandwidth. A phase-detecting means is employed for determining a phase difference between the reconstructed signals. The particle size is determined as a function of the phase difference.

Thus in accordance with the present invention, analog coherent frequency signals can be sensed over a broad frequency bandwidth, converted to digital information, then reconverted to provide reconstructed analog signals confined to a narrow frequency bandwidth for processing. When so confined as to their frequencies, the reconstructed signals lend themselves to processing by analog techniques employing simpler, less costly circuit components, high processing speed, and enhanced reliability due to reduced distortion and noise. This considerably improves the accuracy of measurements obtained in laser phase Doppler and laser Doppler velocimetry systems, and similarly can improve radar and sonar applications involving wide frequency ranges.

IN THE DRAWINGS

For a further appreciation of the above and other features and advantages, reference is made to the following detailed description and to the drawings, in which.

Figure 9:
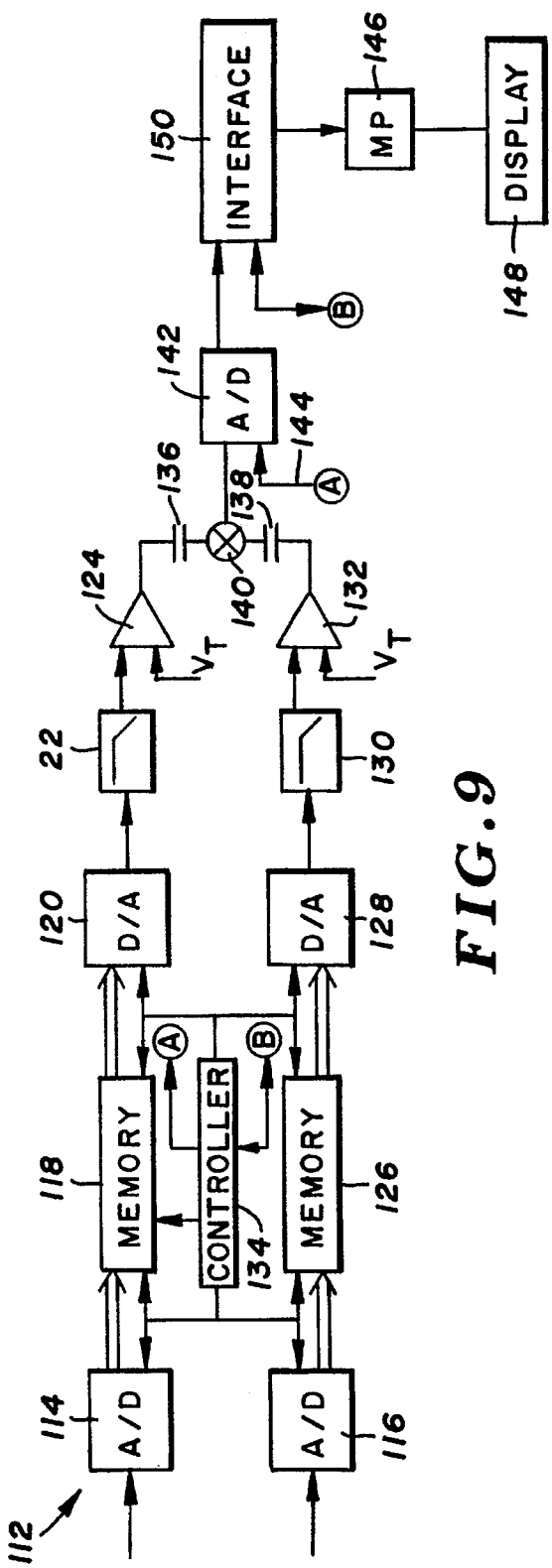
Figure 10:
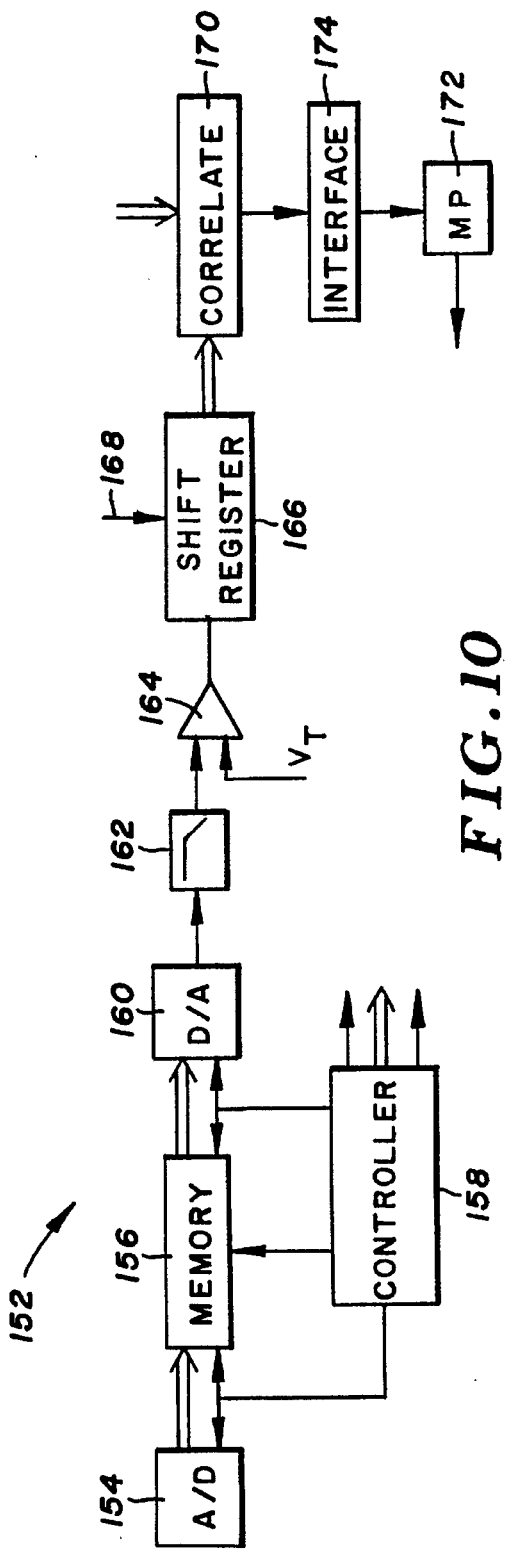

FIG. 9 schematically shows part of a size-measuring device constructed in accordance with the present invention; and FIG. 10 schematically illustrates a part of velocity measurement device constructed in accordance with the present invention.

DETAILED DESCRIPTION OF THE PREFERRED EMBODIMENTS

Figure 1:
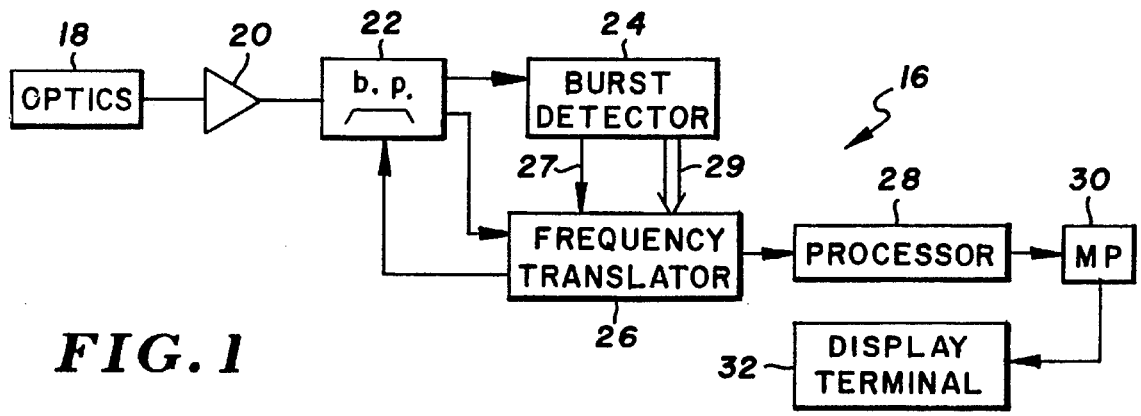
FIG. 1 is a schematic view of a laser Doppler measurement system including signal processing circuitry.

Turning now to the drawings, there is shown in FIG. 1 a laser Doppler system 16 for generating electrical signals based on particles or other light-scattering elements moving through a particle measurement volume. The system processes the signals to determine sizes, velocities, or other information about the moving particles. The system includes optical apparatus 18 for generating an electrical signal as a function of sensed particles. Typically, particles are conveyed by a medium, usually a gas or liquid, through a measuring volume defined by intersecting coherent energy beams. The particle concentration is sufficiently low, and the measuring region sufficiently small, to virtually eliminate the possibility of more than one particle being within the measuring region at any given time. Accordingly, the signal generated by apparatus 18 is a composite signal that includes analog coherent frequency components known as "bursts", and background noise. Particles cause bursts of widely varying amplitudes, frequencies and durations, depending on their size, speed, index of refraction, absorption characteristics and the extent to which they are "centered" as they traverse the measuring volume.

The composite signal, including the bursts and background noise, is provided to an amplifier 20 and the amplified signal then provided to a bandpass filtering device 22, where the signal is bandpass filtered to limit its frequency range. The filtered signal is provided to a burst detector 24 and a frequency translator 26.

Burst detector 24 can be of the type described in U.S. Pat. No. 4,973,969 (Jensen), issued Nov. 27, 1990 and incorporated by reference herein. Burst detector 24 provides a signal burst gate 27 to frequency translator 26 indicating that a burst has been detected, and a frequency range signal 29 indicating an approximate frequency of the burst.

Based on the estimated frequency, frequency translator 26 selects a sampling rate for sampling the analog output of filtering device 22 and converting that output to a digital signal. Within the frequency translator, the digital signal is selectively modified as to its frequency and converted to a reconstructed analog signal corresponding to the filtering device output.

The reconstructed analog signal, confined within a frequency bandwidth of about one octave, is provided to signal processing circuitry 28 for determining the signal frequency, phase or other characteristic corresponding to the physical phenomenon being measured. Processing circuitry 28 provides an output to a microprocessor 30, which can be a personal computer. The corresponding physical measurement values can be shown on a display terminal 32 connected to the microprocessor.

Figure 2:
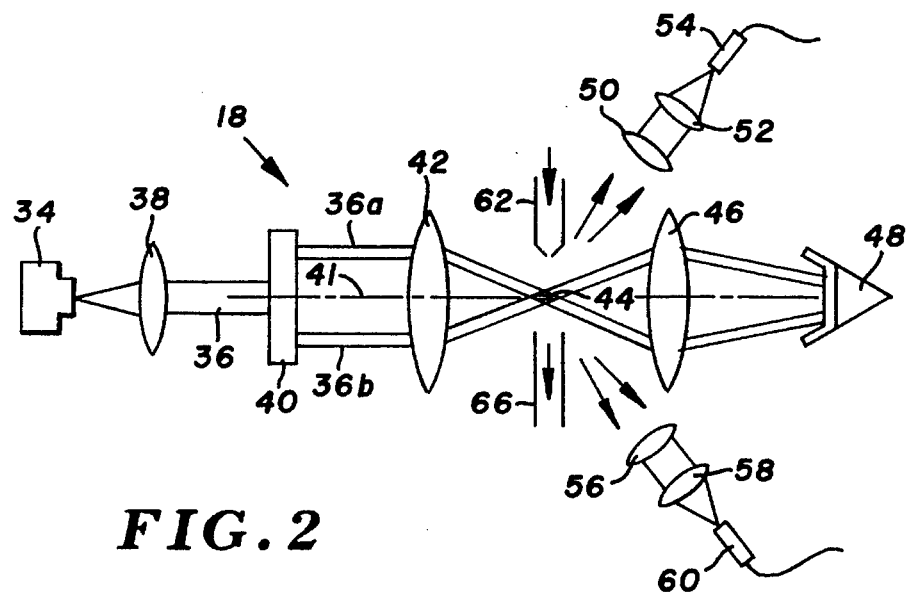
FIG. 2 is a more detailed view of the optical elements of the laser Doppler system.

FIG. 2 shows the optical apparatus in greater detail. To measure one velocity component and/or phase, a laser 34 and appropriate collimating lens 38 generates the coherent energy in a beam 36. Beyond lens 38, a beam splitter 40 receives the collimated beam and generates a pair of collimated laser beams 36a and 36b, directed longitudinally parallel to a beam axis 41, toward a focusing lens 42. Beams 36a and 36b are transversely spaced apart and define a beam plane.

Focusing lens 42 causes beams 36a and 36b to intersect one another at a measurement volume 44. Lens 42 also brings the beams to a focus at the measurement volume. As the beams cross, they interfere with one another to form interference fringes, i.e. alternating regions of higher and lower intensity. Downstream of measurement region 44, beams 36a and 36b encounter a second focusing lens 46 which directs the beams to a beam stop 48.

The optical system further includes optical receivers for sensing laser energy scattered by particles or other elements travelling through the measurement volume. One of the optical receivers includes a convex lens 50 for collecting and columinating scattered light, a photodetector 52, and a convex lens 54 between lens 50 and photodetector 52 for focusing the collected light onto the photodetector. Photodetector 52, which can be an avalanche photodiode, generates an analog voltage as a function of received light. The other optical receiver is similar, and includes a collecting lens 56, a focusing lens 58 and a photodetector 60.

Both of the optical receivers are positioned off of the beam axis to insure in each case that only scattered light reaches the collecting lens via a non-longitudinal path. As shown, collecting lenses 50 and 56 are positioned to receive forward scattered light. The lenses can be positioned to receive back scattered light, if desired. Each collecting lens is positioned so that its focal point occupies the measurement volume. Further, lenses 50 and 56 are positioned such that the respective paths for scattered light to these lenses do not form the same angle relative to the beam axis.

While two optical receivers are shown in FIG. 2, it is to be appreciated that a single optical receiver would suffice for measuring velocities based on Doppler frequencies. Conversely, further optical receivers and two or more pairs of incident beams may be employed in situations of directional ambiguity, or where measurements are taken in two or three dimensions. Examples of these situations include aerodynamic and turbulent flow studies and studies of atomized sprays.

Figure 3:
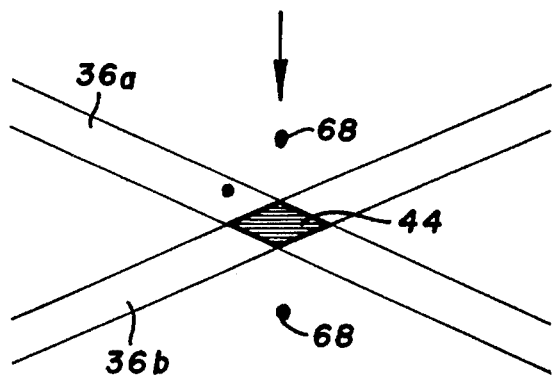
FIG. 3 is an enlarged partial view of FIG. 2.

The optical system detects light-scattering elements conveyed through the measurement region by a liquid or a gas. FIG. 2 shows a nozzle 62 for admitting particle-containing air, into an enclosed chamber (not shown). The air is drawn out of the chamber through an exit conduit 66 for a continuous flow downward as viewed in the figure. A pump (not shown) reduces pressure in conduit 66 to generate the flow, and is controlled to maintain a steady velocity of the air within the chamber. As seen in FIG. 3, the air flow causes a stream of particles 68 to flow through measurement volume 44.

While FIG. 2 illustrates a stream of solid particles carried by air, it is to be appreciated that the optical system can be used to sense different types of discreet elements carried by different media, for example liquid droplets within a gas, gas bubbles within a liquid, solid particles within a liquid medium, or even light-scattering solid elements carried on a moving, light-absorptive solid medium. In any event, especially for particle size measurements the concentration of discreet elements in the medium and the size of the measurement volume insure the presence of at most a single discreet element within the measurement volume. For example, a fluid may include particles at a concentration on the order of $10^4$ particles per cubic centimeter, with an appropriate measuring volume on the order of 100×1,000 microns. Frequently, sufficiently low concentrations occur naturally in fluid flows under test. If not, such flows are diluted before testing, e.g. with ultrapure water or gas. Of course, the optical system elements can be controlled to a certain extent to enlarge or reduce the size of measurement volume 44 in accordance with expected concentrations.

The photodetector outputs are composite signals including background noise segments, and active segments corresponding to a light-scattering element's travel through the measurement volume. The active segments comprise the only useful or meaningful information of the photodetector output signals. These active segments, called coherent frequency bursts, occur intermittently and at random. As noted above, the coherent frequency bursts can vary considerably in their amplitude, frequency and duration. Accordingly, signal processing circuitry must distinguish coherent frequency bursts from background noise, respond rapidly enough to detect short bursts, and handle wide-ranging frequencies and amplitudes.

Figure 4:
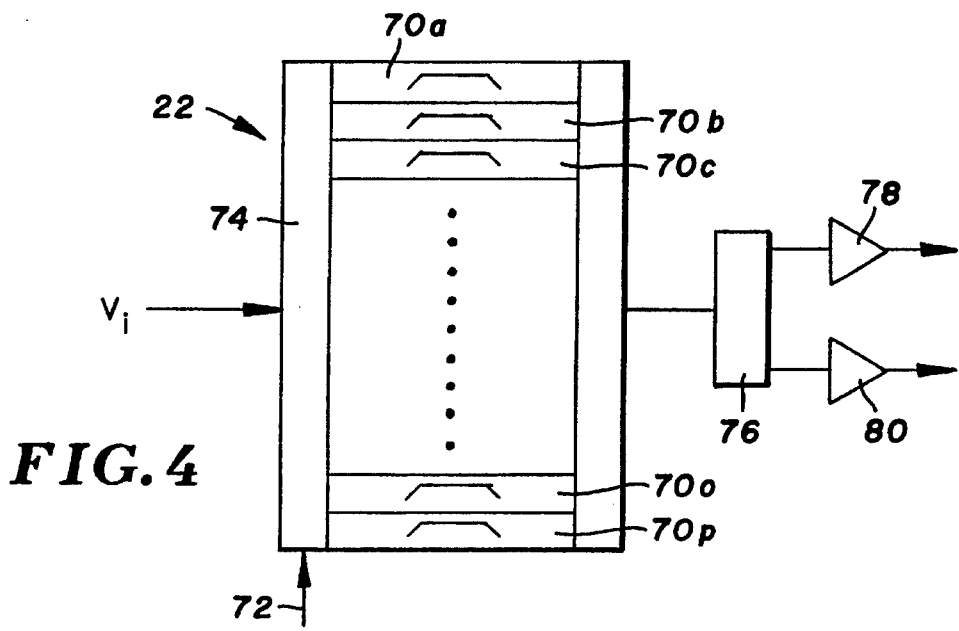
FIG. 4 is a schematic view of a bandpass filtering device shown in FIG. 1.

Filtering device 22 provides a broad frequency band for burst detection. As seen in FIG. 4, the filtering device includes sixteen bandpass filters 70a–70p, encompassing different and overlapping frequency bandwidths. One of these filters is selected for bandpass filtering of the incoming signal. An operator can select a filter by providing a filter selection input as indicated at 72. Alternatively, filter selection logic 74 automatically selects one of filters 70 by comparing data rates and selecting the filter generating the highest data rate. In either event, the selected bandpass filter eliminates high frequency noise and the pedestal (d.c. component) of the burst. Table I lists the overlapping frequency ranges for the bandpass filters in a preferred version of filtering device 22:

TABLE I

| Filter | Frequency Range | Filter | Frequency Range |
|---|---|---|---|
| 70a | 0.3 to 3 kHz | 70i | 3.0 to 20 MHz |
| 70b | 1.0 to 10 kHz | 70j | 5.0 to 35 MHz |
| 70c | 3.0 to 30 kHz | 70k | 10.0 to 50 MHz |
| 70d | 10.0 to 100 kHz | 70l | 20.0 to 60 MHz |
| 70e | 30.0 to 300 kHz | 70m | 30.0 to 70 MHz |
| 70f | 0.1 to 1 MHz | 70n | 40.0 to 80 MHz |
| 70g | 0.3 to 3 MHz | 70o | 50.0 to 100 MHz |
| 70h | 1.0 to 10 MHz | 70p | 10.0 to 100 MHz |

Thus, coherent frequency bursts within a broad range of about 0.3 kHz–100 MHz are selectively bandpass filtered to enhance the signal-to-noise ratio.

The output of filtering device 22 is provided to a resistive power splitter 76. Amplifiers 78 and 80 provide the amplified output to burst detector 24 and to frequency translator 26, respectively. In the manner explained in the aforementioned U.S. Pat. No. 4,973,969, burst detector 24 distinguishes a coherent frequency burst from the background noise of the signal. Upon detecting a coherent frequency signal, burst detector 24 generates two output signals: burst gate signal 27, and frequency range signal 29. The burst gate signal is a one-bit signal active ("high" logic level) when burst detector 24 is receiving a coherent frequency signal from amplifier 78. Frequency range signal 29 is a four-bit digital word indicating an approximate frequency of the burst. The estimated frequency is obtained with multiple, incremented delay lines, in the manner described in the '969 patent.

With reference to the bandwidth over which burst detector 24 receives signals, the four bit frequency range signal is capable of dividing that bandwidth into sixteen different bandwidth segments. However, satisfactory results have been achieved by dividing the burst detector bandwidth into four such bandwidth segments. For example, an incoming decade bandwidth is divided into four one-octave bandwidth segments. Table II illustrates the segmenting of the bandwidth of filter 70h, i.e. 1–10 MHz.

TABLE II

Selected filter: 1–10 MHz
Base sample frequency: F = 50 MHz

| Range (binary): | 0000–0011 | 0100–0111 | 1000–1011 | 1100–1111 |
|---|---|---|---|---|
| Bandwidth | .625–1.25 | 1.25–2.5 | 2.5–5 | 5–10 |

TABLE II-continued

| Segment (MHz): | | | | |
|---|---|---|---|---|
| Divide F: | F/8 | F/4 | F/2 | F |
| Sampling Frequency: | 6.25 MHz | 12.5 MHz | 25 MHz | 50 MHz |

In the same manner, each of the other bandpass filters 70 has an associated base sampling frequency F, which is either applied directly or divided in accordance with the appropriate one of four bandwidth segments. Table III illustrates base frequencies and bandwidth segments for bandpass filters 70b through 70i, with the final four columns indicating the frequency range signal (numerical rather than binary range) and the factor by which the base frequency is divided.

TABLE III

| Filter | Band width | Base F | 0–3: F/8 | 4–7:F/4 | 8–11: F/2 | 12–15:F |
|---|---|---|---|---|---|---|
| 70b | 1–10 kHz | 50 kHz | .625–1.25 kHz | 1.25–2.5 kHz | 2.5–5 kHz | 5–10 kHz |
| 70c | 3–30 kHz | .15 MHz | 1.87–3.75 kHz | 3.75–7.5 kHz | 7.5–15 kHz | 15–30 kHz |
| 70d | 10–100 kHz | .5 MHz | 6.25–12.5 kHz | 12.5–25 kHz | 25–50 kHz | 50–100 kHz |
| 70e | 30–300 kHz | 1.5 MHz | 19–37.5 kHz | 37.5–75 kHz | 75–150 kHz | 150–300 kHz |
| 70f | .1–1 MHz | 5 MHz | 62–125 kHz | 125–250 kHz | 250–500 kHz | .5–1 MHz |
| 70g | .3–3 MHz | 15 MHz | 187–375 kHz | 370–750 kHz | .75–1.5 MHz | 1.5–3 MHz |
| 70h | 1–10 MHz | 50 MHz | .62–1.25 MHz | 1.25–2.5 MHz | 2.5–5 MHz | 5–10 MHz |
| 70i | 3–20 MHz | 100 MHz | N/A | 2.5–5 MHz | 5–10 MHz | 10–20 MHz |

Thus, for the selected bandpass filter 70, frequency range signal 29 indicates one of four bandwidth segments and causes selection of the appropriate sampling frequency rate. Upon comparing each base sampling frequency F (or the result of the indicated division of F) with its associated bandwidth segment, it will be appreciated that so long as the actual frequency lies within the indicated bandwidth segment, the incoming signal will be sampled at a rate of 5–10 samples per cycle.

Figure 5:
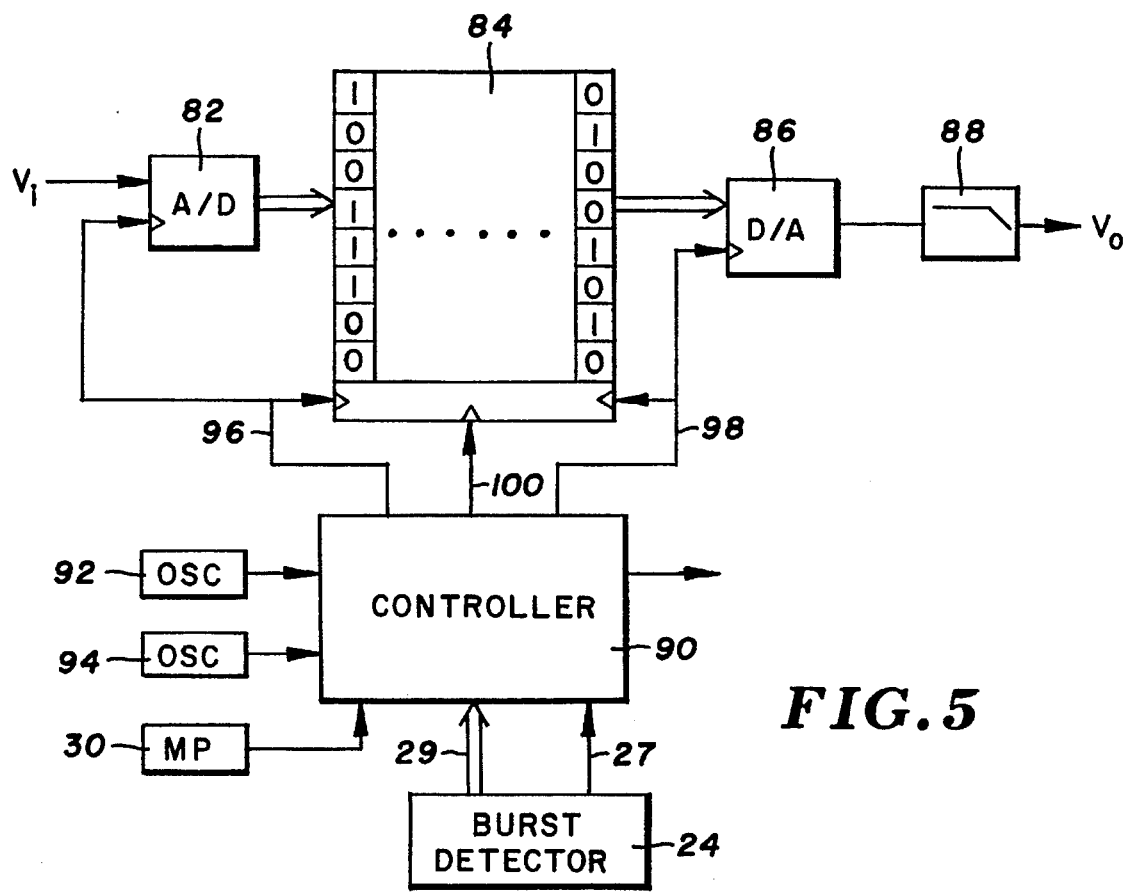
FIG. 5 is a more detailed schematic view of a frequency translator shown in FIG. 1.

FIG. 5 shows frequency translator 26 in greater detail. Translator 26 includes an analog-to-digital converter 82 that receives an analog voltage signal $V_i$ from amplifier 80, and converts $V_i$ to a binary word or digital value representing the voltage. A/D converter 82 is an eight-bit device that generates an eight-bit binary word upon each sampling of $V_i$. The A/D converter output is a sequence of the binary words, each representing the voltage at a different sampling time. The binary words can represent voltage values over 256 increments, with 255 (binary 11111111) representing the highest expected voltage and binary zero representing the most negative voltage, with zero voltage corresponding to 128.

The output of A/D converter 82 is stored to a sequential first-in-first-out memory 84. The memory has an eight-bit width (eight channels) corresponding to the length of the binary words and has a length (in number of bit positions) sufficient to encompass the maximum expected burst length. In the preferred embodiment, the length of memory 84 is 1024.

The contents of memory 84 are read out to a digital-to-analog converter 86 having eight input lines for converting the sequence of digital values into an analog signal. The signal from D/A converter 86 is provided to a low pass filter 88 with a cutoff frequency set at the Nyquist value, i.e. at a maximum of one-half of the frequency at which D/A converter 86 converts the digital value sequence. The output $V_o$ of low pass filter 88 is a reconstructed, frequency-translated analog signal representing the burst.

Frequency translator 26 further includes a controller 90. Inputs to the controller include burst gate signal 27 and frequency range signal 29 from the burst detector; a bandwidth filter selection input from microprocessor 30; and two clocking inputs of 30 MHz and 100 MHz, respectively indicated at 92 and 94. Based on these inputs, controller 90 provides a sampling clock input to A/D converter 82 and to memory 84 via a line 96. The controller provides a read frequency via a line 98 as a clocking input to the memory and to D/A converter 86. Further controller outputs include a reset signal 100 to memory 84 and a bandpass filter select signal 72 to filtering device 22. Controller 90 preferably is a programmable sequencer or a programmable logic device.

A salient feature of the present invention is that despite an initial burst capture range of several orders of magnitude in frequency, and a bandpass filter output $V_i$ that can range over a decade in frequency, the translated analog signal $V_o$ is confined to a frequency range of one octave. This result is achieved through selection and control of the clock rate at which $V_i$ is sampled by A/D converter 82 and stored to memory 84, in conjunction with the clock rate at which the series of digital values is read out of the memory and converted by D/A converter 86.

Semiconductor logic in controller 90, actuated when the burst gate signal goes high, selects one of four available sampling clock rates as a function of: (1) the four-bit binary frequency range signal; and (2) the selected bandwidth filter, whether such selection was automatic or by the operator. The available sampling clock rates are generated by clocks 92 and 94, and depend upon the bandwidth filter selected. For example, the bandwidth of 30–300 kHz has sampling rates that correspond to the following adjacent frequency segments or ranges: 19–37.5 kHz; 37.5–75 kHz; 75–150 kHz and 150–300 kHz. Likewise, each of the remaining burst detector bandwidths corresponding to remaining bandwidth filters 70, is divided into four bandwidth segments. Each preferably encompasses one octave.

Although coherent frequency bursts can differ considerably with one another as to their frequencies, each burst considered alone is substantially uniform in its frequency. Consequently, a sufficiently accurate estimate of burst frequency is obtained within a few cycles of initial detection.

The controller logic selects the sampling frequency based on a predetermined desired number of samples per cycle of the incoming analog signal. For example, if filter 70p was the selected filter (10–100 MHz), and the frequency range signal indicated a burst frequency in the range of 10–20 MHz, then selecting a sampling frequency of 100 MHz would predetermine a number of samples per cycle ranging from 5 to 10, depending upon the actual burst frequency. The number will lie within the range of 5–10, so long as the actual burst frequency is within the range of 10–20 MHz. The range of 5–10 is preferred, although as few as 2.5 samples per cycle can be satisfactory in certain velocity measurement applications.

The sampling frequency enables A/D converter 82, controls the rate at which the A/D converter samples the incoming analog signal $V_i$, and also sets the same rate for storing the digital values to memory 84. To insure that memory 84 is cleared for accepting the digital values, controller 82 provides reset pulse 100 to the memory, responsive to the burst gate signal going high. So long as the gate signal remains high, signal sampling and storage proceed at the selected sampling frequency.

Figure 7:
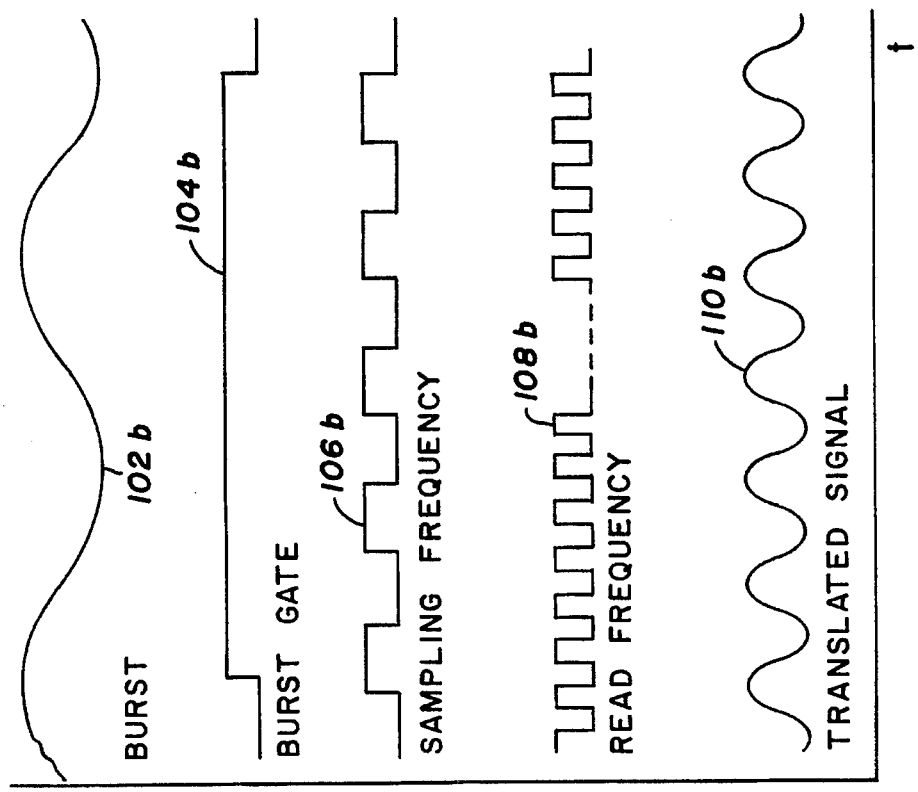
FIGS. 6 and 7 are timing diagrams, showing an electrical signal at various stages of its processing by the frequency translator.
Figure 6:
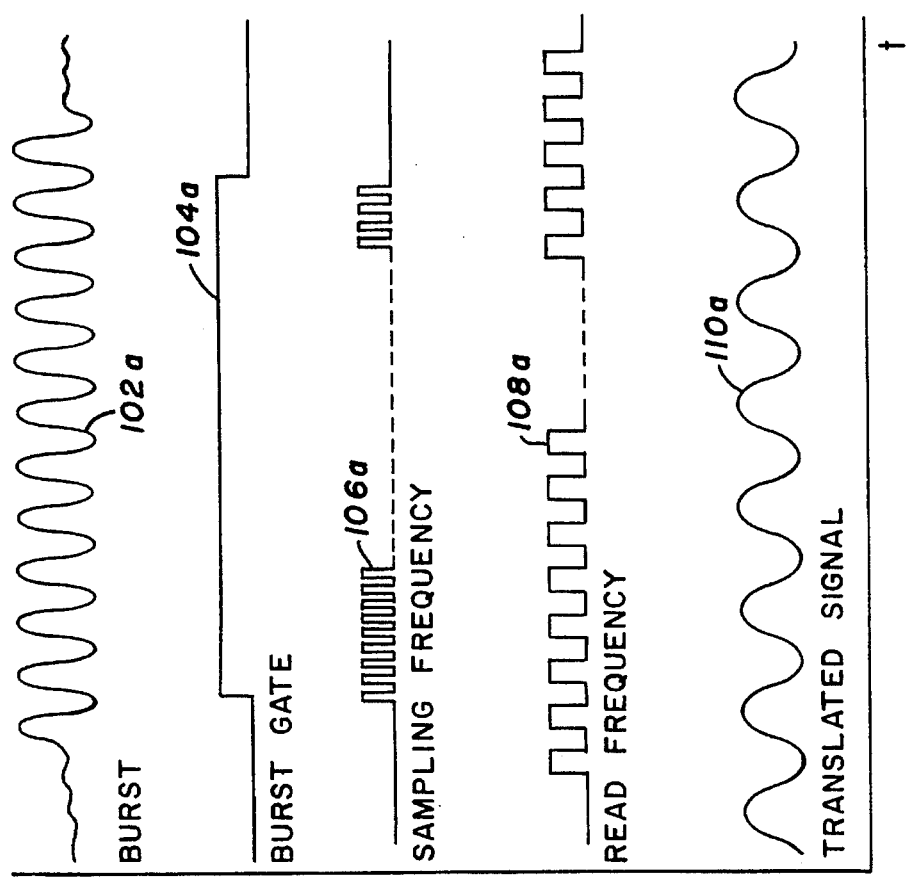

The signal sampling mode is illustrated in FIGS. 6 and 7, respectively for a high frequency analog burst signal 102a and a low frequency analog burst signal 102b. Respective burst gate signals 104a and 104b go high within the first several cycles of the detected burst. Respective sampling frequencies are shown at 106a and 106b. In each case, the sampling frequency is selected to yield a desired number or limited range of samples per cycle of the burst. Since the frequency of analog burst 102a is approximately four times the frequency of analog burst 102b, clocking signal 104a is likewise about four times the clocking frequency 104b.

Returning to FIG. 5, burst gate signals 104 go inactive or "low" in response to detecting the end of the coherent frequency burst. In response, controller 90 shifts from the burst signal sampling mode to a read mode in which the stored binary words are read out of memory 84 and provided to D/A converter 86, in the same sequence in which they were stored. Reading occurs at a read frequency predetermined by the controller. Accordingly, respective digital read signals 108a and 108b have the same frequency, preferably about 40 MHz. Respective frequency-translated analog signals $V_o$ are shown at 110a and 110b in FIGS. 6 and 7.

Analog signals 110a and 110b do not necessarily have the same frequency. However, the higher frequency signal will have a frequency at most double the lower frequency, regardless of the ratio of frequencies for incoming analog signals 102a and 102b.

The selected bandpass filter 70 and the selected sampling frequency 106 are stored in microprocessor 30. Accordingly, despite the similarity in the frequencies of reconstructed signals 110a and 110b, microprocessor 30 calculates and causes terminal 32 to display the true frequencies of the original bursts.

Figure 8:
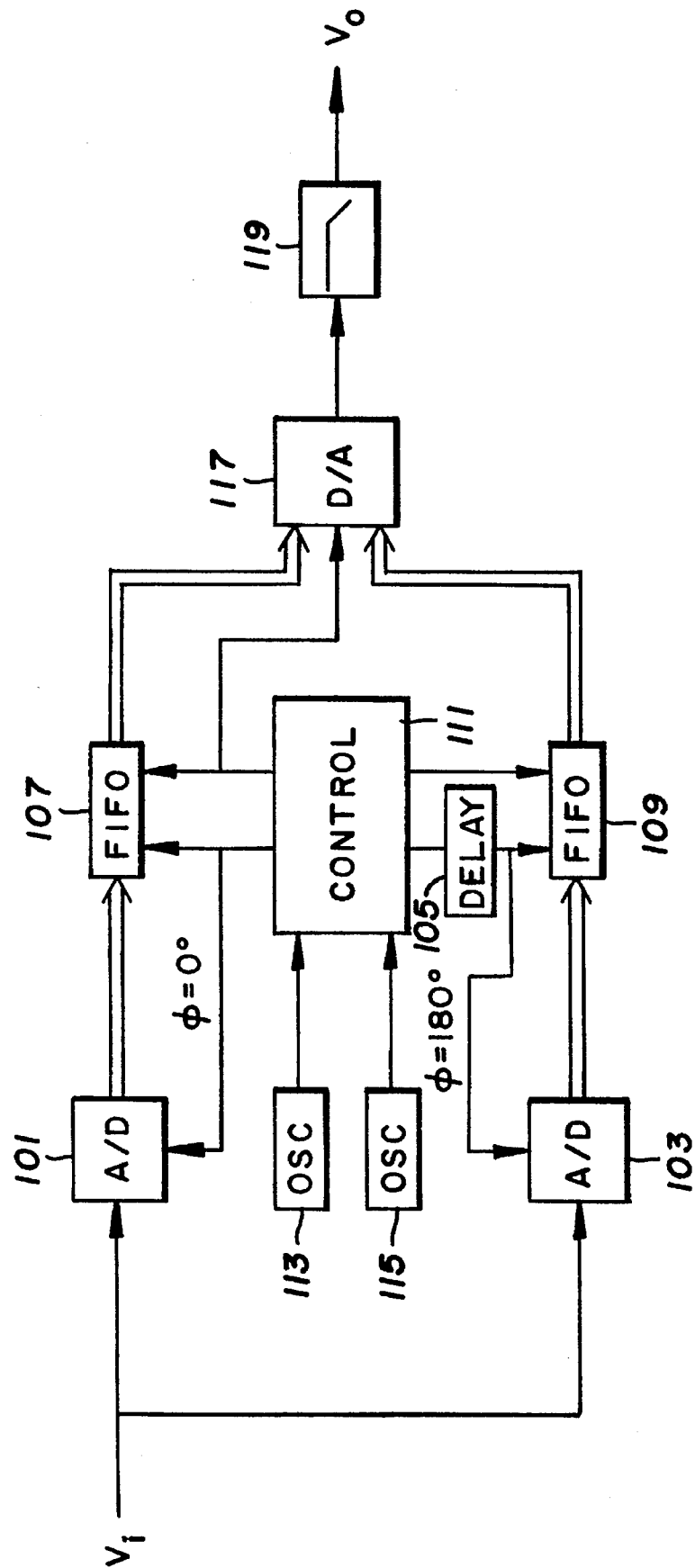
FIG. 8 is a schematic view of an alternative embodiment frequency translator employing selectively phase-shifted A/D converters and memories.

FIG. 8 discloses an alternative embodiment frequency translator in which two A/D converters, phase-adjusted relative to one another, are employed to increase the frequency at which incoming signal $V_i$ is sampled. More particularly, signal $V_i$ is provided to an A/D converter 101 and also to an A/D converter 103. A delay line 105 is configured to phase-shift a sample clock, so that the sampling of the signal provided to A/D converter 103 lags the sampling of the signal provided to A/D converter 101 by 180 degrees. A/D converter 101 provides its digital output to a sequential memory 107, while A/D converter 103 similarly provides its output to a sequential memory 109. A controller 111 receives two clocking inputs of 15 MHz and 50 MHz from clock oscillators indicated at 113 and 115, respectively. The output of delay line 105 is provided to sequential memory 109 as well as A/D converter 103. Accordingly, memory 109 receives the A/D converter output at the 180 degree phase shift with respect to storage of the A/D converter output to sequential memory 107.

Considering just oscillator 115 (50 MHz), the maximum frequency of the resultant controller clocking signal to the A/D converters and the sequential memories is 50 MHz. However, because of the half-cycle phase shift of the clocking signal provided to converter 103 and memory 109 relative to the clocking signal provided to converter 101 and memory 107, the effective rate at which $V_i$ is sampled, is 100 MHz. In the same manner, the frequency of oscillator 113 is effectively doubled to a sampling rate of 30 MHz.

Controller 111 alternately reads sequential memories 107 and 109 to a D/A converter 117. The D/A converter provides its analog output to a low-pass filter 119, the output of which is the frequency-translated burst signal $V_o$. At any given time, only one of the sequential memory outputs is enabled to provide input to D/A 117. In other words, the outputs of sequential memories 107 and 109 are interleaved when provided to the D/A converter. Each sequential memory is read at a frequency of 20 MHz, resulting in a D/A converter input frequency of 40 MHz.

At present, this alternative translator is preferred, in spite of the requirement of an additional A/D converter and sequential memory. Oscillators 113 and 115 are less expensive than their counterpart oscillators 92 and 94. Further, the phase-shifted, lower frequency signals are more robust for enhanced accuracy and reliability.

FIG. 9 shows signal processing circuitry of a phase Doppler device constructed according to the present invention. Device 112 is useful in determining the sizes of particulates, aerosols and droplets in sprays. With reference to FIG. 2, device 112 translates frequencies of analog frequency bursts generated by photodetectors 52 and 60, then measures the phase difference between the respective frequency-translated signals as an indication of particle or droplet size.

For providing the necessary inputs to its frequency translating circuitry, device 112 employs a bandpass filtering device and burst detector with the photodetectors, each similar to its counterpart shown in FIG. 1. The amplified and bandwidth filtered analog signals are provided, respectively, to A/D converters 114 and 116. A/D converter 114 samples the input and stores the digital values to a memory 118. In the read mode, the contents of the memory are provided to a D/A converter 120. The D/A converter output is low-pass filtered at 122 and provided to a comparator amplifier 124.

Likewise, A/D converter 116 stores its output to a memory 126, whose contents are later read into a D/A converter 128, whereupon the D/A converter output is low-pass filtered at 130 and provided to a comparator amplifier 132. A controller 134 provides a sampling frequency in common to both A/D converters and both memories, and likewise provides a common read frequency to the memories and the D/A converters. The controller responds to the same input signals (not shown in FIG. 9) as are provided to controller 90 in FIG. 5.

Each of amplifiers 124 and 132 has a threshold voltage input $V_t$. The amplifier outputs are provided through respective capacitors 136 and 138 to a phase detector 140 for phase detection. The analog phase detector output is provided to an A/D converter 142, which also includes an enabling input 144 from controller 134. The A/D converter output is provided to a microprocessor 146 via an interface 150. A display terminal 148 connected to the microprocessor displays information on the size of particles, droplets or aerosols, based on the phase difference input. Microprocessor 146 is coupled to controller 134 through the interface.

FIG. 10 shows signal processing circuitry of a velocity measurement system 152 which includes optical components such as those shown in FIG. 2, but requires only one of photodetectors 52 and 60. The system also utilizes a burst detector and filtering device as previously discussed. The bandwidth filtered and amplified input $V_i$ is sampled by an A/D converter 154, and the resulting digital values are stored in sequence to a memory 156. A controller 158 governs the sampling and storing rate based on the selected bandwidth filter and the estimated burst frequency range. The controller further governs the rate at which the sequence of binary words is read out of the memory to a D/A converter 160. The D/A converter output is low-pass filtered at 162, and provided to a comparator amplifier 164. A threshold input $V_t$ is also provided to the amplifier.

The amplifier output is provided to a shift register 166, governed by a clock rate from the controller via a line 168. The shift register output is provided to an autocorrelation circuit 170, where a digital correlation of the burst signal is constructed. The output of the autocorrelator is provided to a microprocessor 172 via an interface 174.

While the disclosed embodiments are preferred, it is to be recognized that alternative components can be selected to provide several of the disclosed functions. For example, those skilled in the art are aware of means other than the burst detector, for estimating the burst frequencies and frequency ranges. One-bit digitizing could be employed in lieu of the multibit digitizing of the A/D converters. However, this substitution would result in reduced phase resolution and would require a greater number of samples per burst cycle, e.g. at least ten samples per cycle. An addressable memory register could be employed in lieu of the sequential FIFO memory. Also, digital values read out of the memory could be subject to direct processing, e.g. a fast Fourier transform. However, translation back to an analog signal is preferred at present, since less time is required for signal processing.

Thus in accordance with the present invention, analog coherent frequency signals received over a broad range of frequencies are converted to digital information, then reconstructed as analog signals confined to a much narrower frequency bandwidth. The reconstructed signals can be processed with simpler, less costly circuit components, yet provide more accurate and reliable measurements of physical characteristics, because signal processing is confined to the narrowed frequency bandwidth. Thus, analog and digital processing techniques are combined in a unique manner that affords rapid frequency bandwidth compression and better preserves the signal-to-noise ratio.

What is claimed is:

1. An apparatus for detecting and measuring coherent frequency bursts of a composite signal including the coherent frequency bursts and background noise, said apparatus including:

a detection means receiving the composite signal and having a detector bandwidth to accommodate coherent frequency bursts of the composite signal, for generating an enabling signal whenever receiving a coherent frequency burst, and for generating a frequency range value indicating an estimated burst frequency of the coherent frequency burst in cycles per unit time;

an analog-to-digital conversion means, receiving the composite signal, for sampling the coherent frequency burst to convert the coherent frequency burst to a digital burst signal;

a memory operatively associated with the analog-to-digital conversion means, said analog-to-digital conversion means storing the digital burst signal to the memory as a sequence of digital values, each digital value corresponding to one of the samples of the coherent frequency burst;

a read means operatively associated with the memory, for reading the digital burst signal out of the memory in said sequence, to generate a reconstructed digital burst signal; and a control means operatively associated with the detecting means, the analog-to-digital conversion means, the memory and the read means, for selecting one of a plurality of different sampling rates in samples per unit time, each sampling rate being selected as a function of the frequency range value of its associated one of the frequency bursts and further being selected upon receiving the frequency range value and the enabling signal, wherein each one of the sampling rates is associated with a different bandwidth segment of the detector bandwidth, and wherein the respective sampling rates are generally proportional to the frequencies within their associated bandwidth segments;

said control means applying the selected sampling rate to the analog-to-digital conversion means and to the memory, to cause the analog-to-digital conversion means to sample the associated coherent frequency burst at said selected sampling rate and to store the digital burst signal to the memory at the selected sampling rate;

said control means further applying a predetermined read rate in samples per unit time to the read means, to cause the read means to read the digital burst signal sequentially from the memory at said read frequency, said read rate being substantially constant so that the reconstructed digital burst signals have respective resultant frequencies, in cycles per unit time, as a function of the read rate and the respective selected sampling rates, whereby said resultant frequencies are confined to a resultant frequency range substantially narrower than said detector bandwidth.

2. The apparatus of claim 1 including:

a frequency band pass filtering means receiving the composite signal and providing a filtered composite signal to the detecting means and to the analog-to-digital conversion means.

3. The apparatus of claim 1 wherein:

the analog-to-digital conversion means comprises a multi-bit analog-to-digital converter that generates each said digital value as a multiple bit binary word upon each sampling of the coherent frequency burst.

4. The apparatus of claim 3 wherein:

the memory comprises a synchronous first-in-first-out memory having a plurality of bit channels equal in number to the bit length of the binary words.

5. The apparatus of claim 1 wherein:

the analog-to-digital conversion means comprises a plurality of multibit analog-to-digital converters, each of said analog-to-digital converters generating a multiple bit binary word each time it samples the coherent frequency burst, said analog-to-digital converters being driven with respective clocking signals having the same clock rate but phase-shifted relative to one another, whereby said selected sampling rate is equal to the clock rate multiplied by the number of analog-to-digital converters.

6. The apparatus of claim 5 wherein:

the memory comprises a plurality of synchronous first-in-first-out memories, each of the memories receiving the output of an associated one of the analog-to-digital converters.

7. The apparatus of claim 1 wherein:

a frequency ratio of the highest frequency of the detector bandwidth to the lowest frequency of the detector bandwidth, is at least three times a frequency ratio of the highest frequency to the lowest frequency in each of the bandwidth segments.

8. The apparatus of claim 7 wherein:

said frequency ratio of the detector bandwidth is about ten and said frequency ratio in each of the bandwidth segments is about two.

9. The apparatus of claim 7 wherein:

each said sampling rate is predetermined with respect to its associated bandwidth segment to insure a sampling rate in the range of 5–10 samples in each cycle of the coherent frequency burst.

10. The apparatus of claim 1 further including:

a digital-to-analog conversion means operatively associated with the memory to receive the reconstructed digital signal, for converting the reconstructed digital signal to a reconstructed analog burst signal.

11. The apparatus of claim 10 further including:

a low pass filtering means operatively associated with the digital-to-analog conversion means, for low pass filtering the reconstructed analog burst signal.

12. The apparatus of claim 1 further including:

a storage means for retaining a record of the selected sampling rate, and logic means for determining the burst frequency based upon the sampling rate and the frequency of the reconstructed digital burst signal.

13. The apparatus of claim 1 wherein:

the control means comprises a programmable sequencer.

14. A process for measuring a coherent frequency analog signal, including the steps of:

receiving an analog coherent frequency signal, and generating a frequency range value indicating an approximate frequency in cycles per unit time of the received analog coherent frequency signal;

predetermining a plurality of signal sampling rates in samples per unit time, each sampling rate corresponding to a different one of a plurality of frequency bandwidth segments that together provide a frequency bandwidth for receiving the analog coherent frequency signal, said sampling rates being generally proportional to the frequencies within their associated bandwidth segments;

selecting one of the plurality of signal sampling rates, based on the frequency range value;

converting the analog coherent frequency signal to a first digital signal by sampling the analog coherent frequency signal at the selected sampling rate;

storing the first digital signal to a memory as a sequence of digital values, each digital value corresponding to one sample of the analog coherent frequency signal;

reading the first digital signal out of the memory in said sequence and at a predetermined read rate, to generate a second digital signal having a resultant frequency based on the selected sampling rate and the read rate, said read rate being substantially constant to confine the resultant frequency to a frequency range substantially narrower than said frequency bandwidth; and converting the second digital signal to an analog signal, to generate a reconstructed analog coherent frequency signal having said resultant frequency.

15. The process of claim 14 wherein:

the step of converting the analog coherent frequency signal to the first digital signal comprises generating multiple eight-bit binary words, each of the first digital values consisting of one of the eight-bit binary words.

16. The process of claim 14 including the further step of:

predetermining the range of each said bandwidth segment, such that the ratio of the highest frequency to the lowest frequency in the bandwidth segment is at most two.

17. The process of claim 16 including the further step of:

selecting each of the sampling rates with reference to the bandwidth segment represented by its associated frequency range value, such that the resulting sampling rate has a frequency of at least 2.5 times the frequency of the analog coherent frequency signal.

18. The process of claim 14 including the further step of:

low pass filtering the reconstructed analog coherent frequency signal.

19. The process of claim 14 further including the step of:

measuring said resultant frequency and determining the frequency of the received analog coherent frequency signal based on the resultant frequency and the selected sampling rate.

20. The process of claim 14 wherein:

the coherent frequency analog signal is part of a composite signal that further includes background noise;

said steps of generating a frequency range value, selecting one of the signal sampling rates, converting the analog coherent frequency signal, and storing the first digital signal, all are performed only while a detection means, responsive to sensing the analog coherent frequency burst within the composite signal, generates an enabling signal; and the step of reading the first digital signal out of the memory is not initiated until the detecting means ceases to generate the enabling signal.

21. A particle measuring device, including:

a means for generating two linearly propagated coherent energy beams, and a beam guide means for causing the beams to intersect one another at a predetermined beam angle and interfere with one another over a measuring region at their intersection;

a particle moving medium for carrying particles through the measuring region, each of the particles scattering the coherent energy as the particle passes through the measuring region;

a first energy detecting means for receiving a portion of the scattered coherent energy and for generating a first analog signal comprising a coherent frequency burst as a function of the received coherent energy;

a first detection means for receiving the first analog signal and for generating a first frequency range value to indicate an approximate burst frequency of the first analog signal;

a first analog-to-digital conversion means receiving the first analog signal, and for converting the first analog signal to a first digital signal;

a first memory operatively coupled to the analog-to-digital conversion means, for storing the first digital signal;

a first read means operatively associated with the memory for reading the first digital signal sequentially out of the memory at a substantially constant read rate;

a control means operatively associated with the first detection means, the first analog-to-digital conversion means, the first memory, and the first read means, for selectively generating one of a plurality of sampling frequencies as a function of the first frequency range value, each sampling frequency corresponding to a different one of several first frequency bandwidth segments cooperating to provide a frequency bandwidth of the first detecting means, wherein the first frequency bandwidth encompasses a substantially wider range of frequencies than does any one of the first frequency bandwidth segments;

the control means applying the selected sampling rate to the first analog-to-digital conversion means, to cause the first analog-to-digital conversion means to sample the first analog signal at the selected sampling rate when so converting, and to store the first digital signal to the memory as a sequence of first digital values, each first digital value corresponding to one of the samples;

the control means further causing the first read means to read the stored data from the first memory in said sequence and at the read rate to generate a second digital signal at a resultant frequency based on the read rate and the selected sampling rate, whereby the resultant frequency lies within a frequency range substantially narrower than the first frequency bandwidth; and a digital-to-analog conversion means for converting the second digital signal to a second analog signal comprising a reconstructed coherent frequency burst having said resultant frequency.

22. The apparatus of claim 21, further including:

a means for determining the frequency of the first analog signal, based on the resultant frequency and the selected sampling rate; and a means for determining the velocity of the particle, based on the frequency of the first analog signal.

23. The apparatus of claim 21 wherein:

the first detecting means includes a bandpass filtering means comprised of a plurality of bandwidth filters, and means for individually selecting one of the bandwidth filters to set the detecting means bandwidth.

24. The apparatus of claim 21 wherein:

the ratio of the highest frequency to the lowest frequency within each of the bandwidth segments is at most about two.

25. The apparatus of claim 24 wherein:

the sampling rates are predetermined with respect to their corresponding bandwidth segments, such that each sampling rate is at most ten times and at least 2.5 times the frequency of the first analog signal.

26. The apparatus of claim 21 further including:

a means for low pass filtering the second analog signal.

27. The apparatus of claim 21 further including:

a second photodetecting means spaced apart angularly from the first photodetecting means, for generating a third analog signal comprising a coherent frequency burst signal based on the scattered coherent energy;

a second analog-to-digital conversion means receiving the third analog signal, for converting the third analog burst signal to a third digital signal; and a second memory operatively associated with the second analog-to-digital conversion means, for storing the third digital signal;

a second read means operatively associated with the second memory, for reading the third digital signal sequentially out of the second memory at the read rate;

said control means further being operatively associated with the second detecting means, the second analog-to-digital conversion means, the second memory and the second read means, for causing the second analog-to-digital conversion means to sample the second analog signal at the selected sampling rate when so converting, and causing the second read means to read the third digital signal sequentially out of the second memory at the read rate to provide a fourth digital signal;

a second digital-to-analog conversion means operatively associated with the second read means and the second memory, for converting the fourth digital signal into a fourth analog signal; and a phase detecting means for determining a phase difference between the second analog signal and the fourth analog signal, and means for determining the size of the particle based on the phase difference.

28. The apparatus of claim 27 further including:

a means for low-pass filtering the second analog signal.

29. A process for detecting and measuring coherent frequency signals, including:

using a first detector to detect analog coherent frequency signals having frequencies within a first frequency range, and for each of the analog coherent frequency signals so detected:

(a) generating a frequency value representing an approximate frequency of the analog coherent frequency signal;

(b) sampling the analog coherent frequency signal at a sampling rate to generate a sequence of digital values, and storing the digital values in said sequence to a digital memory;

(c) reading the digital values out of the digital memory in said sequence and at a read rate, to provide a reconstructed digital signal;

(d) converting the reconstructed digital signal to a reconstructed analog signal; and (e) selecting a ratio of the sampling rate to the read rate corresponding to the frequency value; and controlling the sampling rate and the read rate whereby said selected ratios increase as the frequency values increase and decrease as the frequency values decrease, to confine the reconstructed analog signals within a second frequency range substantially narrower than the first frequency range.

30. The process of claim 29 further including:

using a second detector to detect the analog coherent frequency signals;

performing steps (a)–(e) with respect to said second detector, to provide further reconstructed analog signals; and determining a difference in phase between the reconstructed analog signal and the further reconstructed analog signal corresponding to each analog coherent frequency signal.

31. The process of claim 29 wherein:

said step of controlling the sampling rate and the read rate includes varying the sampling rate based on changes in the frequency values while maintaining said read rate constant.

32. The process of claim 31 wherein:

said step of varying the sampling rate includes segmenting said first frequency range into a plurality of frequency range segments, each said segment corresponding to a different frequency value, providing a plurality of predetermined sampling rates with each of the sampling rates corresponding to one of the frequency range segments, and selecting the sampling rate corresponding to the frequency range segment in which the analog coherent frequency signal is detected.

33. The process of claim 29 wherein:

the size of said first frequency range is at least three times the size of the second frequency range, with the size of each range being a ratio of the highest frequency to the lowest frequency within that range.

\* \* \* \* \*